US007023255B1

(12) United States Patent
Mercer

(10) Patent No.: US 7,023,255 B1

(45) Date of Patent: Apr. 4, 2006

(54) LATCH WITH DATA JITTER FREE CLOCK LOAD

(75) Inventor: Douglas A. Mercer, Bradford, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/874,513

(22) Filed: Jun. 23, 2004

(51) Int. Cl.
*H03K 3/356* (2006.01)

(52) U.S. Cl. ...................... 327/199; 327/201; 327/211; 327/212; 327/218

(58) Field of Classification Search ................ 327/199, 327/200, 201, 202, 203, 204, 205, 208, 211, 327/212, 214, 215, 218
See application file for complete search history.

(56) References Cited

U.S. PATENT DOCUMENTS 5,689,257 A 11/1997 Mercer et al. .............. 341/133
6,031,477 A * 2/2000 Mercer ....................... 341/144
6,344,816 B1 * 2/2002 Dedic ......................... 341/144
6,366,113 B1 * 4/2002 Song ........................... 326/24
6,734,816 B1 * 5/2004 Morimoto et al. .......... 341/144
2004/0140931 A1 * 7/2004 Vesuna ....................... 342/451

OTHER PUBLICATIONS

"Sense Amplifier-Based Flip-Flop," Nikolic et al. *IEEE International Solid-State Circuits Conference*. 1999.

* cited by examiner

*Primary Examiner*—Kenneth B. Wells
*Assistant Examiner*—Khareem E. Almo
(74) *Attorney, Agent, or Firm*—Gauthier & Connors

(57) ABSTRACT

A digital latch includes a latch circuit having first and second data inputs, first and second data outputs, and a clock signal input. The latch circuit has a first load value relative to a clock driver when data at the first and second data inputs is non-changing. The latch circuit has a second load value relative to a clock driver when data at the first and second data inputs is changing. The digital latch further includes a load compensation circuit operatively connected to the first and second data inputs of the latch circuit and to the first and second data outputs of the latch circuit. The load compensation circuit provides a first compensation load value upon the clock driver when data at the first and second data inputs is non-changing and provides a second compensation load value relative upon the clock driver when data at the first and second data inputs is changing such that a sum of the first load value and the first compensation load value equals a sum of the second load value and the second compensation load value.

20 Claims, 6 Drawing Sheets

AVDD2
D
1
DB
2
AGND2
10
11
12
S2
S1
13
14
30
VSB1
31
32
G2
AGND1
33
G1
34
VSB1
AVDD2
S1
S2
51
52
59A
D
DB
53
54
55
56
D
DB
59B
57
58
S1
S2
CLK
AGND2
50

LATCH WITH DATA JITTER FREE CLOCK LOAD

FIELD OF THE PRESENT INVENTION

The present invention is generally relates to a latch. In particular, the present invention relates to a latch that is relatively free of data pattern induced clock jitter.

BACKGROUND OF THE PRESENT INVENTION

Digital to analog converters are generally constructed of a number of switches which are selectively operated by a multi-bit digital input signal to produce corresponding currents to be summed as an analog output signal. Such digital to analog converters ordinarily are formed as integrated circuits, with each switch comprising two transistors arranged as a differential switch-pair. The individual transistors of such a switch-pair typically are controlled by complementary signal sources which operate to turn one switch ON while turning the other switch OFF. One of the two switches is coupled to a summing bus, and the other switch is coupled to a common line such as ground.

One problem with switching arrangements is that in standard CMOS logic circuits, the propagation speed of a low to high transition is different to that of a high to low transition and can be altered by the ratio of PMOS to NMOS device strengths. Unequal delay for low to high and high to low transitions from the edge of the clock signal, which causes new data to be passed into the output switch of a digital-analog converter, causes even-order distortion components in the reconstructed output waveform.

One proposed solution to this problem is illustrated in FIG. 1. As shown in FIG. 1, the circuit includes latches 10 and 20 and level shifters 30 and 40. The latch 10 receives signals D and DB from data nodes through transistors 1 and 2, respectively. The input signals D and DB are a true signal and a complementary signal, the complementary signal being present at node DB. Also, latch 20 receives signals AD and AB from data nodes through transistors 3 and 4, respectively. The input signals AD and AB are a true signal and a complementary signal, the complementary signal being present at node AB. In the first signal path, the signal D, as it is applied to latch 10, is allowed to change only during the time that the clock signal on node CLK is low. This blocks the transfer of the new data through the transistors 2 and 1, which serve as pass gates, into a static latch 10.

Transistor groups 11–14 and 21–24 form a “cross coupled inverter” latch which holds the data state while CLK is low. In the state where node S1 is high (S2 low), transistor 31 of the level shifter 30 is ON (transistor 32 is OFF) in order to connect node G2 to bias voltage VSB1. Also, transistor 33 of the level shifter 30 is ON (transistor 34 is OFF) in order to connect node G1 to a ground terminal AGND1.

Moreover, in the state where node A1 is high (A2 low), transistor 41 of the level shifter 40 is ON (transistor 42 is OFF) in order to connect node G3 to bias voltage VSB1. Also, transistor 43 of the level shifter 40 is ON (transistor 44 is OFF) in order to connect node G4 to a ground terminal AGND1.

In the state where node S1 is low (S2 high), transistor 34 is ON (transistor 33 is OFF) connecting node G1 to VSB1. Also, transistor 32 is ON (transistor 31 is OFF) connecting node G2 to AGND1.

Moreover, in the state where node A1 is low (A2 high), transistor 44 is ON (transistor 43 is OFF) connecting node G4 to VSB1. Also, transistor 42 is ON (transistor 41 is OFF) connecting node G3 to AGND1.

If the input signal D transitions from high to low while input CLK is low, when CLK transitions from low to high, the change of D from high to low arrives at node S1 before the complementary low to high change arrives at node S2. This occurrence causes transistor 31 of the level shifter 30 (and transistor 33 of the level shifter 30) to turn OFF before transistor 32 turns ON. During this time (when S1 and S2 are both low), nodes G1 and G2 are floating, and by virtue of their inherent capacitance remain at nearly the same voltage they were before.

When the low to high transition on node S2 arrives, the two transistors 32 and 34 turn ON. This causes node G2 to go to ground at exactly the same time as node G1 goes to VSB1.

If the input signal AD transitions from high to low while input CLK is low, when CLK transitions from low to high, the change of AD from high to low arrives at node A1 before the complementary low to high change arrives at node A2. This occurrence causes transistor 41 of the level shifter 40 (and transistor 43 of the level shifter 40) to turn OFF before transistor 42 turns ON. During this time (when A1 and A2 are both low), nodes G3 and G4 are floating, and by virtue of their inherent capacitance remain at nearly the same voltage they were before.

When the low to high transition on node A2 arrives, the two transistors 42 and 44 turn ON. This causes node G3 to go to ground at exactly the same time as node G4 goes to VSB1.

The propagation delay from the input CLK to the point in time when the output is switching is the same for both a 0 to 1 and a 1 to 0 change in the input D. This delay is set by the slower 0 to 1 delay through the inverters and not the faster 1 to 0 delay.

In the prior art circuit described above, the circuit uses twin data paths, one for the thermometer-coded data and an alternate path, which switches only when the other data path does not; i.e., AD switches state whenever D does not. Although this circuit provides a number of advantages; such as a data independent load to the circuit driving input CLK, the current drawn from the power supply being data independent, the disturbance on the final switch gate drive bias (VSB1) being data independent, and a more data independent disturbance on the output switch common source node; it does, however, require additional circuitry to generate the AD and AB input signals.

Therefore, it is desirable to realize a circuit that addresses the requirement for additional circuitry for the generation of these alternate inputs AD and AB. Moreover, it is desirable to create a latch that removes the need for the additional circuits while providing data independent load on the clock driver, a large source of distortion.

SUMMARY OF THE PRESENT INVENTION

A first aspect of the present invention is a digital latch with a data jitter free clock load. The digital latch includes a latch circuit having first and second data inputs, first and second data outputs, and a clock signal input. The latch circuit has a first load value relative to a clock driver when data at the first and second data inputs is non-changing. The latch circuit has a second load value relative to a clock driver when data at the first and second data inputs is changing. The digital latch further includes a load compensation circuit operatively connected to the first and second data inputs of the latch circuit and to the first and second data outputs of the latch circuit. The load compensation circuit provides a first compensation load value upon the clock driver when data at the first and second data inputs is non-changing and provides a second compensation load value relative upon the clock driver when data at the first and second data inputs is changing such that a sum of the first load value and the first compensation load value equals a sum of the second load value and the second compensation load value.

A second aspect of the present invention is a digital latch with a data jitter free clock load. The digital latch includes a latch circuit having first and second latch data inputs, first and second latch data outputs, and a clock signal input. The latch circuit has a load value relative to a clock driver. The load value changes in response to a change in a state of the data received at the first and second data inputs. The digital latch further includes a first sense amplifier having first and second data inputs, first and second outputs, and a clock signal input. The first output of the first sense amplifier is connected to the first latch data input. The second output of the first sense amplifier is connected to the second latch data input. The digital latch also includes a second sense amplifier having first and second data inputs, first and second outputs, and a clock signal input. The first output of the second sense amplifier is connected to the first latch data output. The second output of the second sense amplifier is connected to the second latch data output. The first input of the first sense amplifier is connected to the first input of the second sense amplifier. The second input of the first sense amplifier being connected to the second input of the second sense amplifier.

A third aspect of the present invention is a digital latch with a data jitter free clock load. The digital latch includes a first inverter stage connected to a first input, the first inverter stage including a first inverter stage first floating node and a first inverter stage first pre-charging device, the first inverter stage including a first inverter stage second floating node and a first inverter stage second pre-charging device; a second inverter stage connected to a second input, the second inverter stage including a second inverter stage first floating node and a second inverter stage first pre-charging device, the second inverter stage including a second inverter stage second floating node and a second inverter stage second pre-charging device; and a latch circuit having first and second latch data inputs. The first latch data input is operatively connected to the first inverter stage. The second latch data input is operatively connected to the second inverter stage. The latch circuit has first and second latch data outputs. The first inverter stage first pre-charging device pre-charges the first inverter stage first floating node to a first pre-determined value each clock cycle. The second inverter stage first pre-charging device pre-charges the second inverter stage first floating node to the first pre-determined value each clock cycle.

A fourth aspect of the present invention is a digital latch with a data jitter free clock load. The digital latch includes a first inverter stage connected to a first input, the first inverter stage including a first inverter stage first floating node and a first inverter stage first pre-charging device, the first inverter stage including a first inverter stage second floating node and a first inverter stage second pre-charging device; a second inverter stage connected to a second input, the second inverter stage including a second inverter stage first floating node and a second inverter stage first pre-charging device, the second inverter stage including a second inverter stage second floating node and a second inverter stage second pre-charging device; and a latch circuit having first and second latch data inputs. The latch circuit has first and second latch data outputs. The first inverter stage first floating node is formed at a common connection between a first inverter stage first inverting device, a first inverter stage first clock transistor, and the first inverter stage first pre-charging device. The second inverter stage first floating node is formed at a common connection between a second inverter stage first inverting device, a second inverter stage first clock transistor, and the second inverter stage first pre-charging device. The first inverter stage includes a first inverter stage second floating node formed at a common connection between a first inverter stage second inverting device, a first inverter stage second clock transistor, and said first inverter stage second pre-charging device. The second inverter stage includes a second inverter stage second floating node formed at a common connection between a second inverter stage second inverting device, a second inverter stage second clock transistor, and said second inverter stage second pre-charging device. The output of first inverter stage first clock transistor is connected to the first latch data input. The output of second inverter stage first clock transistor is connected to the second latch data input. The first inverter stage first pre-charging device pre-charges the first inverter stage first floating node to a pre-determined value when the first inverter stage first clock transistor is OFF. The second inverter stage first pre-charging device pre-charges the second inverter stage first floating node to the pre-determined value when the second inverter stage first clock transistor is OFF.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAIL DESCRIPTION OF THE PRESENT INVENTION

Figure 1:
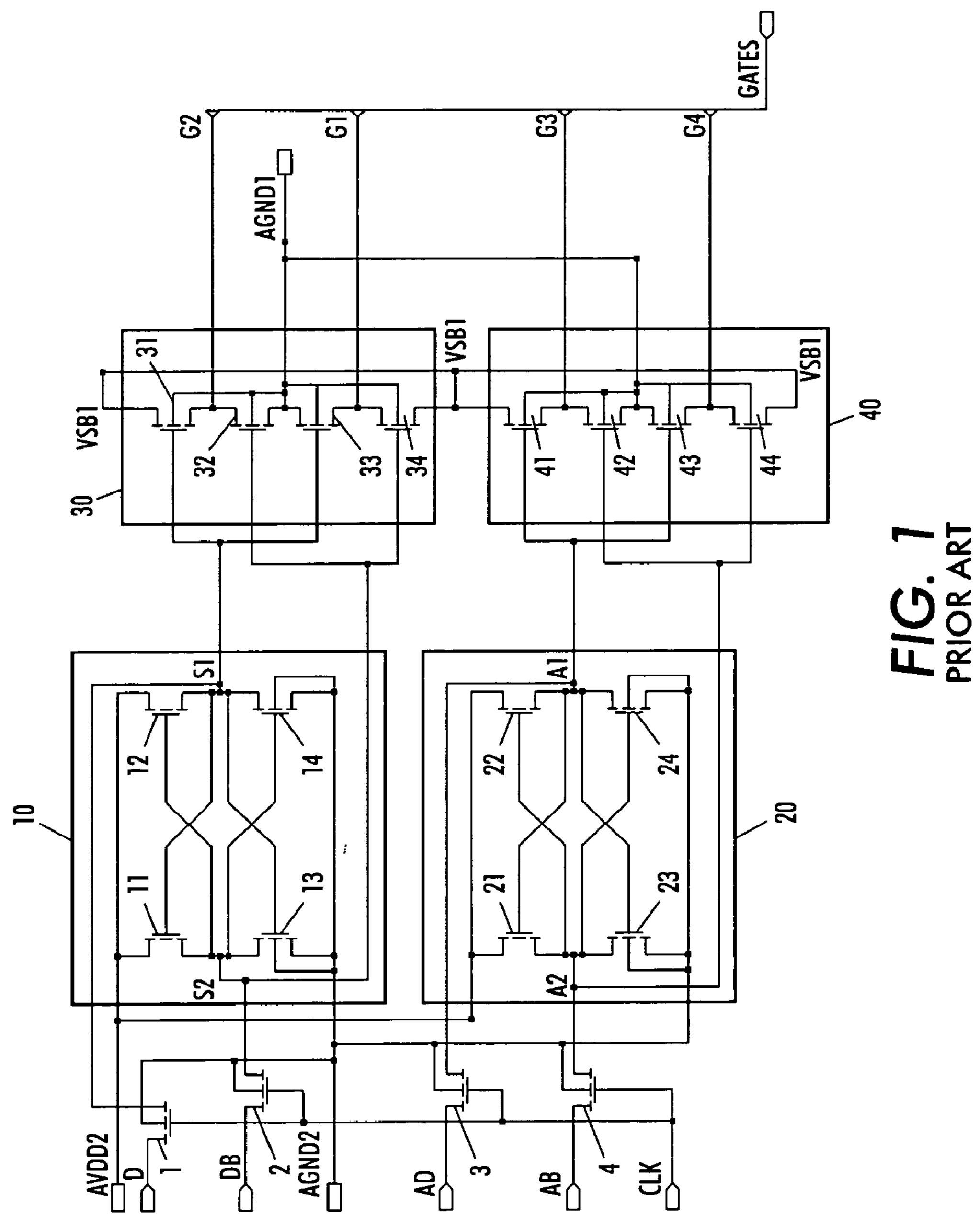
FIG. 1 is a schematic circuit diagram of a prior art latch configuration.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

The present invention provides a latch design that reduces the effect of different loading on the clock driver when the latch is forced to switch states versus when it is not. To more fully understand the concepts of the present invention, an example of such a latch circuit in accordance with the concepts of the present invention is shown in FIG. 2.

Figure 2:
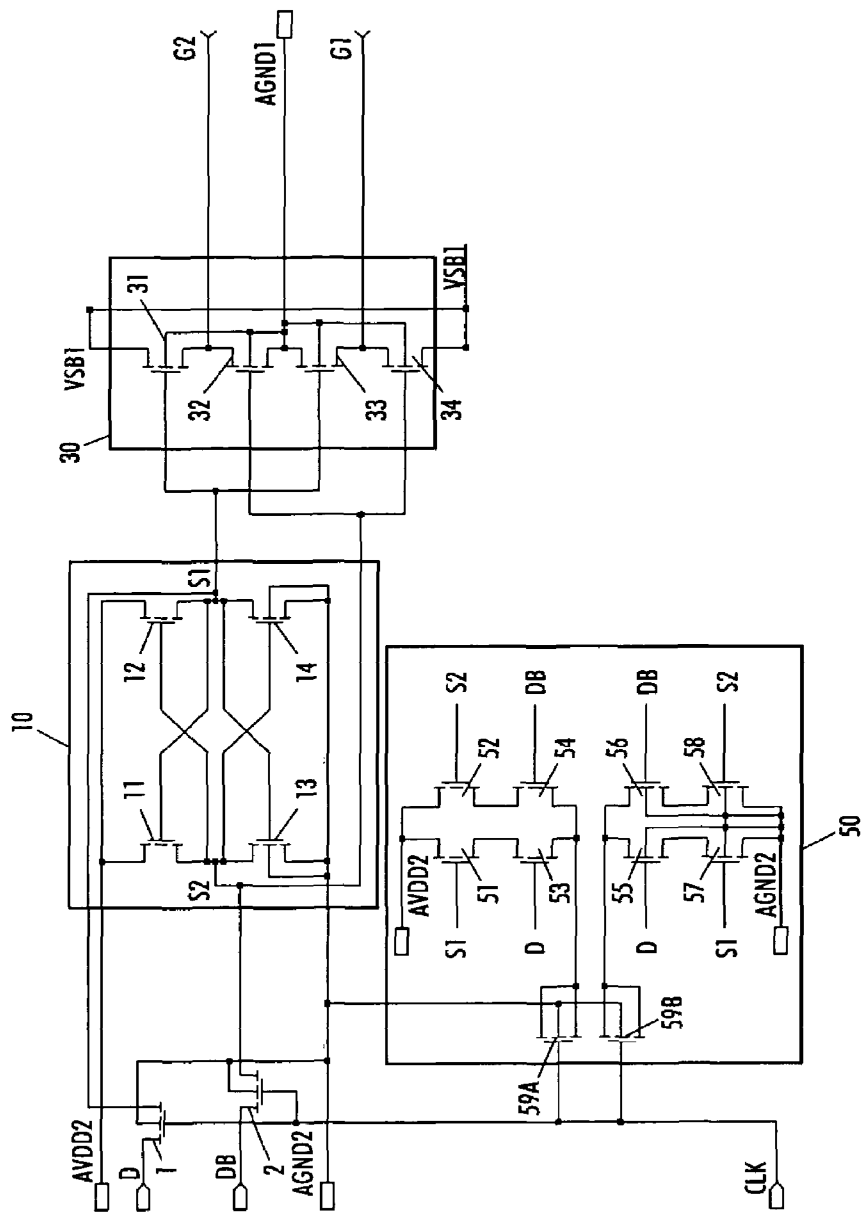
FIG. 2 is a schematic diagram of one embodiment of a latch configuration in accordance with the concepts of present invention.

As illustrated in FIG. 2, inputs from nodes D and DB are connected to transistors 1 and 2, respectively. Transistors 1 and 2 are connected to a clock signal through node CLK and to a latch 10. Latch 10 is a "cross coupled inverter" latch formed by transistors 11–14.

Latch 10 is connected to a level shifter 30 formed of transistors 31–34 and a load compensation circuit 50 formed of transistors 51–58.

As noted above, all latches to some extent present a load to the circuit which drives the clock input that depends on whether the content (state) of the latch is changing or not. Given the finite strength of the driving circuit, the rise time of the clock waveform is a function of the number of the multiplicity of latches connected to a common clock driver which are changing their state at a given time.

The circuit of FIG. 2 balances out this difference by switching in a variable load through transistors 59A and 59B depending on the present and next state of the latch. This is done by logically combining the inputs on nodes D and DB with the latch signals S1 and S2 with transistors 51–54 in the case of transistor 59A and transistors 55–58 in the case of transistor 59B.

If the latch 10 is not changing state with, for example, S1 high and input on node D also high (S2 and DB low), transistors 55 and 57 will be ON, shorting transistor 59B to ground and transistors 52 and 54 will be ON, shorting transistor 59A to AVDD2. On the other hand, if the latch 10 is about to change state with D low and S1 high (DB high and S2 low), transistor 55 will be OFF, as well as transistors 58, 51 and 54, thus isolating the two transistors 59A and 59B and their associated capacitance, thereby reducing the load on the clock line.

If these switches 59A and 59B were ideal; i.e., zero ON resistance and no parasitic capacitance, transistors 59A and 59B would be the same size as transistors 1 and 2. Since the switches 59A and 59B are not ideal, it is necessary to make the capacitor devices a little larger than the actual latch pass gates. Also, it is less of a problem to make the devices tied to D and DB wider because they are driven by rather large drivers. The extra devices connected to S1 and S2 will tend to slow down these edges, which will adversely affect the waveforms ultimately seen at the outputs G1 and G2. It is thus desirable to minimize the size of devices 51–58.

While the circuit of FIG. 2 does not provide a data independent current draw from the AVDD2 supply, it is a lower power design than the circuit illustrated in FIG. 1.

As previously noted, all latches suffer from state dependent load on the clock input to some extent or another, but there is a class of timing elements, latches, or flip-flops that does present a state independent load on the clock. These devices are sense-amplifier flip-flops.

Conventional sense-amplifier flip-flops provide state independent load on the clock by having the sense amplifier part of the front end which is reset back to the supply every clock cycle (when clock is low).

These conventional circuits have two major drawbacks. The first is that they are slower than most other conventional latches. The second is the NAND gate R-S flip—flip of the sense-amplifier flip-flop generates a rather high crossing point for S1 and S2. This creates a problem when driving the level shifter devices. Moreover, there is a much longer time when both switches are ON thus shorting the VSB1 bias to ground for more time resulting in a much larger glitch on VSB1.

A potential solution to the high crossing point shortcomings can be realized by flipping the circuit over and making the R-S flip-flop with NOR gates. However, since this potential solution uses NOR gates for the R-S flip-flop the delay is much longer. Also, the sense of the clock is now flipped over and the outputs change on the falling edge, which is different than what is conventionally used.

Figure 3:
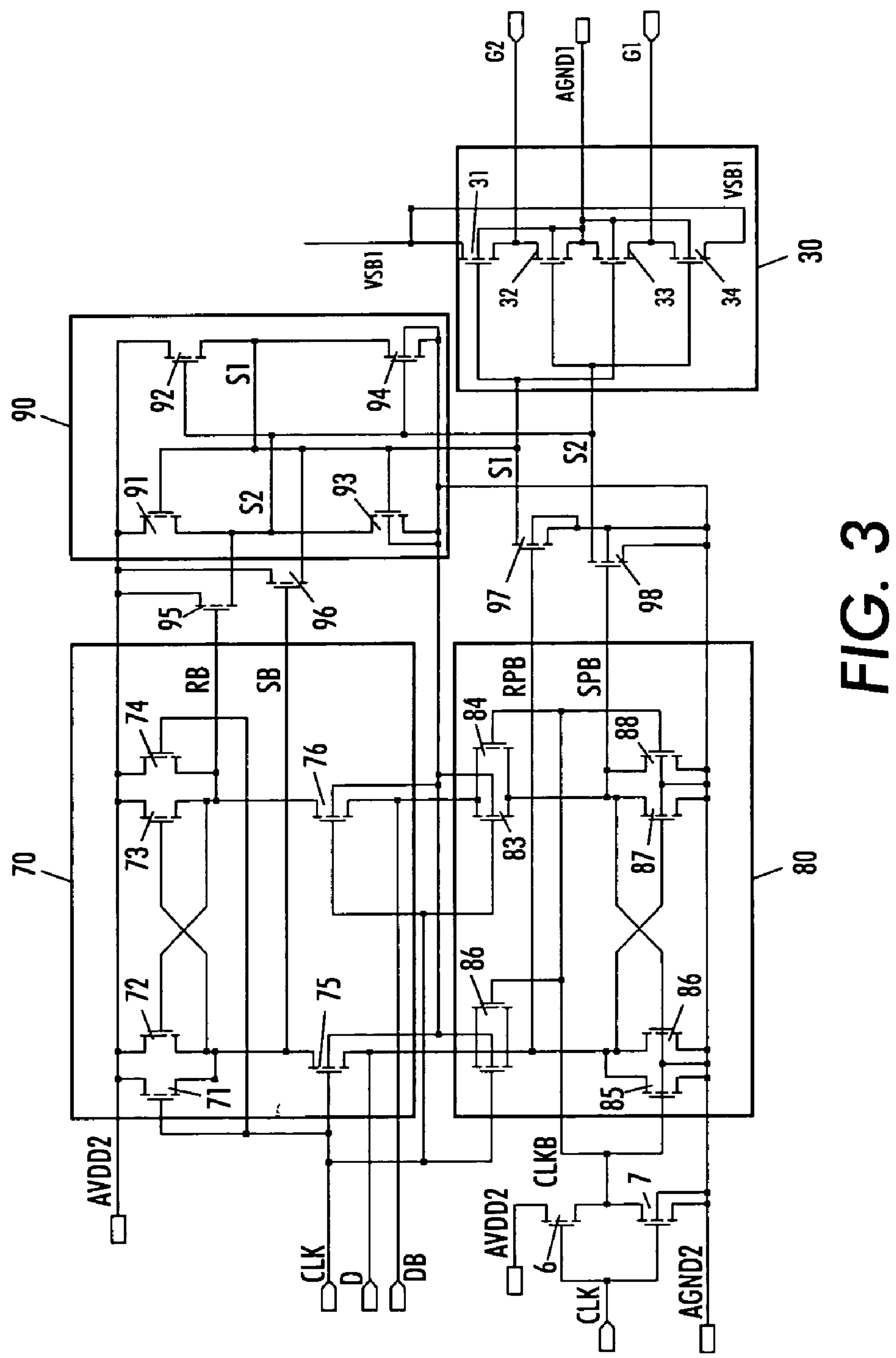
FIG. 3 is a schematic diagram of a double sense-amplifier flip-flop in accordance with the concepts of present invention.

With respect to another embodiment of the present invention, the present invention provides a solution to the high crossing S1, S2 shortcoming of the NAND version of the sense-amplifier flip-flop and the longer delay of the NOR version by combining the two together as shown in FIG. 3.

As illustrated in FIG. 3, a double sense-amplifier flip-flop includes a first sense amplifier 70, formed of transistors 71–76, and a second sense amplifier 80, formed of transistors 81–88. First sense amplifier 70 is connected to latch 90, formed of transistors 91–94, through transistors 95 and 96. Moreover, second sense amplifier 80 is connected to latch 90 through transistors 97 and 98. Furthermore, latch 90 is connected to level shifter 30, formed of transistors 31–34.

The double or dual sense amplifier flip-flop is formed from P-type and N-type sense amplifiers. The sense amplifiers have been modified from the single sense amplifier flip-flop configuration by swapping the order of the data and clock switch devices. The data devices can thus be eliminated and their function taken over by the devices in the inverters, which drive the inputs D and DB. The second sense amplifier 80 needs an inverted clock, which is made by transistors 6 and 7. The single R-S flip-flop, latch 90, is driven in a push-pull fashion on the pull up side by transistors 95 and 96 and on the pull down side by transistors 97 and 98.

Utilizing the double or dual sense amplifier flip-flop of FIG. 3, the S1 and S2 cross very close to the middle of the swing. Moreover, the double or dual sense amplifier flip-flop of FIG. 3 realizes a much more symmetric shape of the G1 and G2 waveforms. This improves the shape of the disturbance on the common source node of the output current switches.

The circuit of FIG. 3 uses a large number of transistors and thus will take up more area on the integrated circuit than the original latch of FIG. 2. An alternative design is illustrated in FIG. 4.

Figure 4:
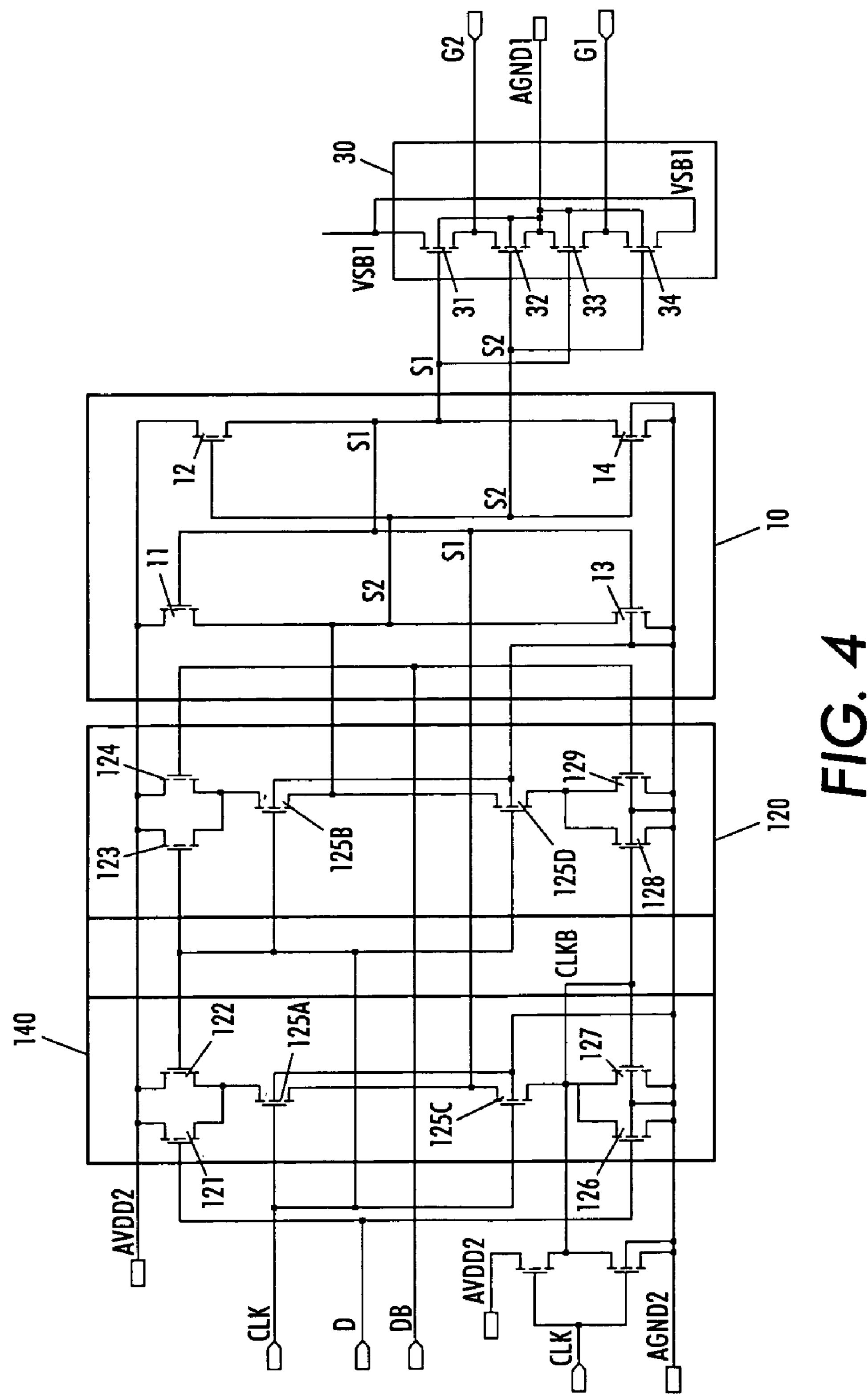
FIG. 4 is a schematic diagram of a latch configuration with a pre-charge feature in accordance with the concepts of present invention.

As illustrated in FIG. 4, the circuit includes a first inverter stage 140 connected to the D input, formed of transistors 121, 122, 125A, 125C, 126, and 127, and a second inverter stage 120 connected to the DB input, formed of transistors 123, 124, 125B, 125D, 128, and 129. The inverter stages 140 and 120 are further connected to input CLK which serves to gate ON and OFF the outputs of the stages through transistors 125A–125D. The outputs of inverter stages 140 and 120 are further connected to latch 10 at nodes S1, S2. Latch 10 is further connected to level shifter 30, formed of transistors 31–34.

Clock transistors 125A–125D create four "floating" nodes; the common connection of devices 121, 122, and

125A, the common connection of devices 123, 124, and 125B, the common connection of devices 126, 127, and 125C, and the common connection of devices 128, 129, and 125D; which will be pre-charged by transistors 122, 123, 127, and 128, respectively, during the time when the clock transistors are OFF. The pre-charging of these nodes to the same value each clock cycle, regardless of the state of the latch or input data, effectively removes any variation in the load presented on the CLK input. This circuit, with the pre-charge feature included, reduces the load variation by a factor of twenty to from as much as 1 nSec to around 50 fsec.

Figure 5:
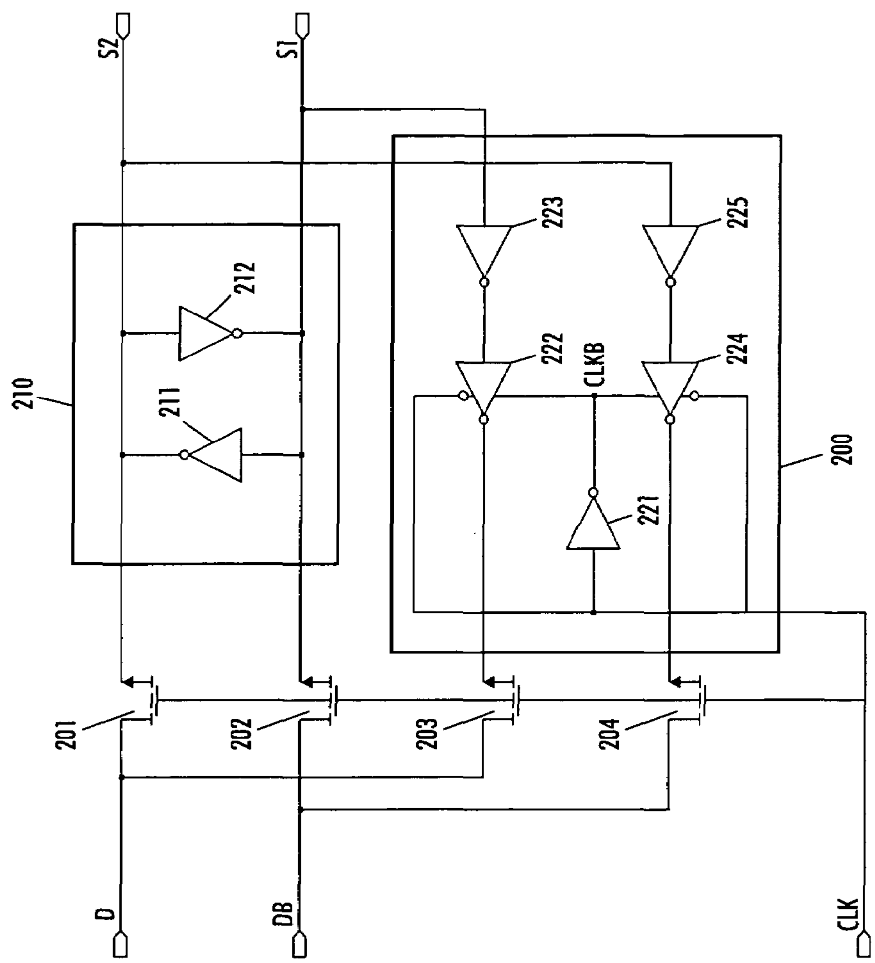
FIG. 5 illustrates another embodiment of a latch configuration in accordance with the concepts of present invention.

FIG. 5 illustrates another latch configuration according to the concepts of the present invention. As illustrated in FIG. 5, a latch 210 includes inverters 211 and 212 and transistors 201 and 202, which receive input signals from nodes D and DB, respectively. FIG. 5 further illustrates a load compensating circuit 220, which includes inverters 221–225, to vary the load, through transistors 203 and 204, in a way opposite to the load provided by transistors 201 and 202.

The gate current that the driver, driving the CLK input, needs to supply to transistor 201 is a function of the relative voltage levels present at input node D and output node S2 when the CLK input is pulled high, turning ON transistor 201. If the voltage on input node D is the same as on output node S2, a somewhat smaller amount of charge is needed to turn ON transistor 201 than if input node D is not equal to output node S2.

Transistor 203 shares a drain connection to the input node D with transistor 201, but the source is connected to the output of inverter 222, where the source of transistor 201 is connected to the output of inverter 211. It is noted that the voltage level present at the output of inverter 222 will be opposite that of inverter 211 because inverter 222 has as its input, an inverted version of output node S1, through inverter 223, which is always the complement of output node S2.

Inverter 222 is of the gated variety and will be in a high impedance state when CLK is high and either driven high or low, depending on its input when CLK is low. So in operation when CLK transitions from low to high, the input node D will see a path through transistor 201 to inverter 211 and through transistor 203 to inverter 222.

In the case, for example, when input node D is low and output node S2 is low (data not changing) transistor 201 has a low on both source and drain while transistor 203 has a low on the drain and a high on the source.

For the opposite case when input node D is still low but output node S1 is high (data about to change) transistor 201 now has a low on the drain and a high on the source and transistor 203 has a low on both source and drain.

The same explanation applies to the input node DB and transistors 202 and 204, inverters 212 and 224, and output node S1 from the symmetry of the circuit.

So, for all possible combinations of the inputs and current state of the latch, of the four switches (transistors 201–204), one will have high to low across drain to source, one will have low to high across drain to source, one will have high to high across drain to source, and one will have low to low across drain to source. Therefore, as far as the charge that is needed to be supplied by the clock driver to turn ON these four switches (transistors 201–204), it should be invariant with the data pattern.

Shortly after the CLK line goes high, the latch formed by cross connected inverters 211 and 212 will have regenerated or not depending on the relative state of the latch making the signals levels across transistors 201 and 202 equal to zero and inverters 222 and 224 will now be in tri-state, equalizing the voltages across transistors 203 and 202. When CLK returns low, transistors 201–204 turn OFF and inverters 222 and 224 come out of tri-state so that the cycle is ready to start all over again.

The delay to switching inverters 222 and 224 to tri-state is about as long as the regeneration time of the latch. The only necessary thing to do is balance the relative strengths of the weak inverters, inverters 211 and 212 used in the latch, with the gated inverters 222 and 224 to insure data independent loading on the clock driver.

Figure 6:
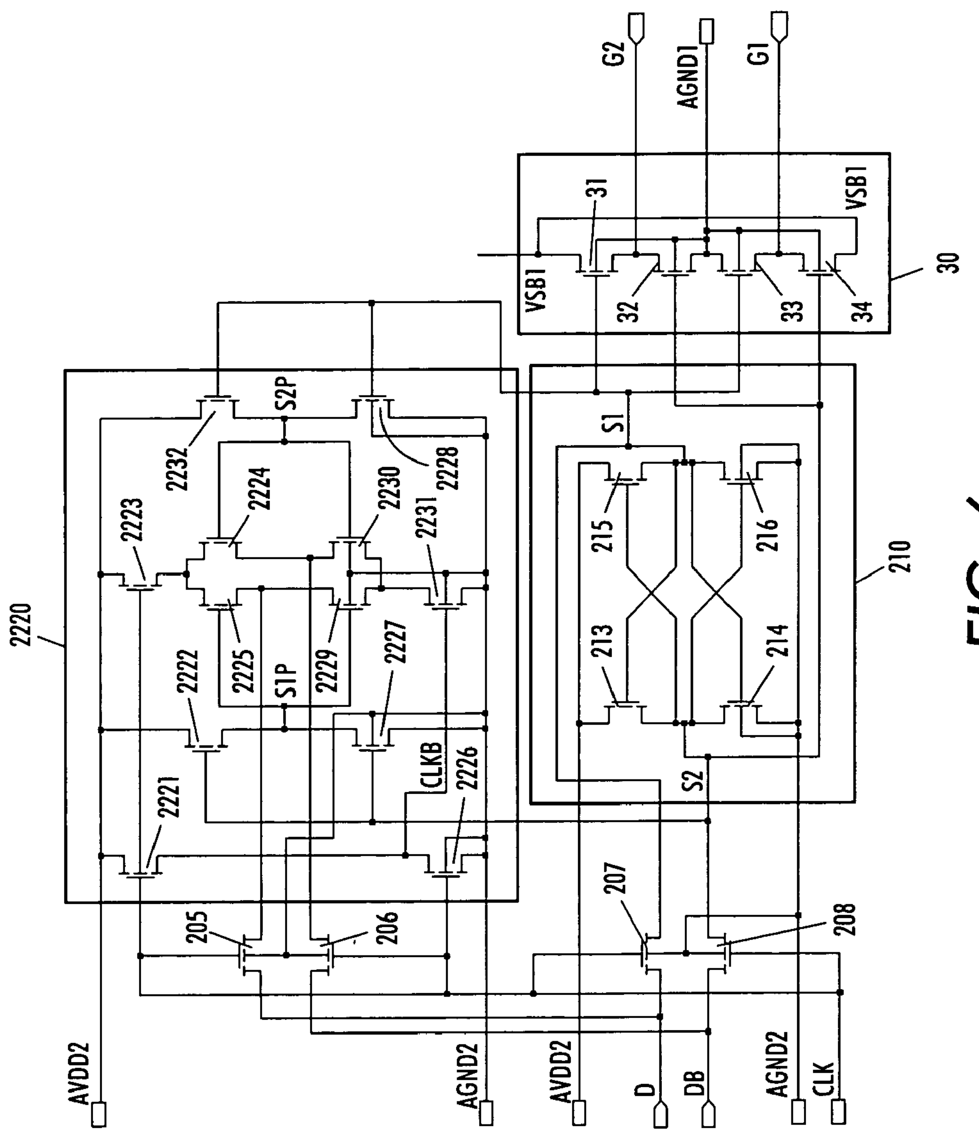
FIG. 6 is a transistor level diagram of the latch embodiment of FIG. 5 in accordance with the concepts of present invention.

FIG. 6 shows the transistor level design of FIG. 5. Transistors 205–208 are four pass transistors driven by the CLK input. Transistors 207 and 208 are connected to a latch 210, formed of cross-connected transistors 213–216. The latch 210 is connected to load compensation circuit 2220, formed of transistors 2221–2232. Transistor pair 2232 and 2228 and transistor pair 2222 and 2227 form inverters which are equivalent to inverters 223 and 225 in FIG. 5 which drive gated inverters (transistors 2224, 2225 and 2229, 2230) equivalent to inverters 222 and 224 in FIG. 5. These two gated inverters are driven by the same signals and thus are able to share a common P side switch 2223 and common N side switch 2231.

In the preferred embodiment, the sizes of the extra devices connected to CLK are minimized to reduce the static loading on the CLK input.

As stated above the relative strength of the gated inverters need to be matched to that of the inverters in the latch. The strength of the gated inverter is the combination of two PMOS or two NMOS devices in series. Given the desire to have the smallest devices on CLK, the devices should be made small (approximately the same as in the latch) and the devices driven by the inverters are made wide enough to not affect the strength very much.

It is also noted that, in a preferred embodiment, the amount of extra load put on the latch outputs S1, S2 is limited so the inverter devices (transistor pair 2232 and 2228 and transistor pair 2222 and 2227) are made small.

In summary, the present invention provides a latch design that reduces the effect of different loading on the clock driver when the latch is forced to switch states versus when it is not.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A digital latch with a data jitter free clock load, comprising:

a latch circuit having first and second data inputs, first and second data outputs, and a clock signal input, said latch circuit having a first load value relative to a clock driver when data at said first and second data inputs is non-changing, said latch circuit having a second load value relative to a clock driver when data at said first and second data inputs is changing; and a load compensation circuit, operatively connected to said first and second data inputs of said latch circuit and to said first and second data outputs of said latch circuit, said load compensation circuit providing a first compensation load value upon the clock driver when data at said first and second data inputs is non-changing and said load compensation circuit providing a second compensation load value relative upon the clock driver when data at said first and second data inputs is changing such that a sum of said first load value and said first compensation load value equals a sum of said second load value and said second compensation load value.

2. The digital latch as claimed in claim 1, wherein said load compensation circuit includes:

a first gated inverter having an input operatively connected to said first data output of said latch circuit and an output operatively connected to said first data input of said latch circuit; and a second gated inverter having an input operatively connected to said second data output of said latch circuit and an output operatively connected to said second data input of said latch circuit.

3. The digital latch as claimed in claim 1, wherein said first and second gated inverters are gated by the clock signal received by said latch circuit.

4. The digital latch as claimed in claim 1, wherein said load compensation circuit includes:

a first inverter having an input operatively connected to said first data output of said latch circuit;

a first gated inverter having an input operatively connected to an output of said first inverter and an output operatively connected to said first data input of said latch circuit;

a second inverter having an input operatively connected to said second data output of said latch circuit; and a second gated inverter having an input operatively connected to an output of said second inverter and an output operatively connected to said second data input of said latch circuit.

5. The digital latch as claimed in claim 1, wherein said latch circuit includes:

a first switch connected to said first data input and said clock signal input;

a second switch connected to said second data input and said clock signal input;

a first inverter having an input connected to said second switch and said second data output and having an output connected to said first switch and said first data output; and a second inverter having an input connected to said first switch and said first data output and having an output connected to said second switch and said second data output.

6. The digital latch as claimed in claim 1, wherein said latch circuit includes:

a first switch connected to said first data input and said clock signal input;

a second switch connected to said second data input and said clock signal input;

a first inverter having an input connected to said second switch and said second data output and having an output connected to said first switch and said first data output; and a second inverter having an input connected to said first switch and said first data output and having an output connected to said second switch and said second data output; and said load compensation circuit including, a first load inverter having an input operatively connected to said first data output of said latch circuit, a first gated inverter having an input operatively connected to an output of said first load inverter, a first load switch connected to said first data input of said latch circuit, said clock signal input, and an output operatively of said first load inverter, a second load inverter having an input operatively connected to said second data output of said latch circuit, a second gated inverter having an input operatively connected to an output of said second load inverter, and a second load switch connected to said second data input of said latch circuit, said clock signal input, and an output operatively of said second load inverter.

7. The digital latch as claimed in claim 1, wherein said load compensation circuit includes:

a first logic circuit having inputs operatively connected to said first and second data outputs of said latch circuit and said first and second data inputs of said latch circuit;

a second logic circuit having inputs operatively connected to said first and second data outputs of said latch circuit and said first and second data inputs of said latch circuit;

a first capacitor operatively connected to said first logic circuit and said clock signal input of said latch circuit; and a second capacitor operatively connected to said second logic circuit and said clock signal input of said latch circuit;

said first logic circuit causing said first capacitor to be shorted to a predetermined voltage source when a state of said first data output of said latch circuit is equal to a state of said first data input of said latch circuit and a state of said second data output of said latch circuit is equal to a state of said second data input of said latch circuit;

said second logic circuit causing said second capacitor to be shorted to ground when a state of said first data output of said latch circuit is equal to a state of said first data input of said latch circuit and a state of said second data output of said latch circuit is equal to a state of said second data input of said latch circuit.

8. The digital latch as claimed in claim 7, wherein said first logic circuit causes said first capacitor to be electrically isolated from said clock signal input when a state of said first data output of said latch circuit is not equal to a state of said first data input of said latch circuit and a state of said second data output of said latch circuit is not equal to a state of said second data input of said latch circuit;

said second logic circuit causes said second capacitor to be electrically isolated from said clock signal input when a state of said first data output of said latch circuit is not equal to a state of said first data input of said latch circuit and a state of said second data output of said latch circuit is not equal to a state of said second data input of said latch circuit.

9. The digital latch as claimed in claim 1, wherein said latch circuit includes:

a first switch connected to said first data input and said clock signal input;

a second switch connected to said second data input and said clock signal input;

a first inverter having an input connected to said second switch and said second data output and having an output connected to said first switch and said first data output; and a second inverter having an input connected to said first switch and said first data output and having an output connected to said second switch and said second data output; and said load compensation circuit including, a first logic circuit having inputs operatively connected to said first and second data outputs of said latch circuit and said first and second data inputs of said latch circuit, a second logic circuit having inputs operatively connected to said first and second data outputs of said latch circuit and said first and second data inputs of said latch circuit, a first capacitor operatively connected to said first logic circuit and said clock signal input of said latch circuit, and a second capacitor operatively connected to said second logic circuit and said clock signal input of said latch circuit;

said first logic circuit causing said first capacitor to be shorted to a predetermined voltage source when a state of said first data output of said latch circuit is equal to a state of said first data input of said latch circuit and a state of said second data output of said latch circuit is equal to a state of said second data input of said latch circuit;

said second logic circuit causing said second capacitor to be shorted to ground when a state of said first data output of said latch circuit is equal to a state of said first data input of said latch circuit and a state of said second data output of said latch circuit is equal to a state of said second data input of said latch circuit.

10. The digital latch as claimed in claim 9, wherein said first logic circuit causes said first capacitor to be electrically isolated from said clock signal input when a state of said first data output of said latch circuit is not equal to a state of said first data input of said latch circuit and a state of said second data output of said latch circuit is not equal to a state of said second data input of said latch circuit;

said second logic circuit causes said second capacitor to be electrically isolated from said clock signal input when a state of said first data output of said latch circuit is not equal to a state of said first data input of said latch circuit and a state of said second data output of said latch circuit is not equal to a state of said second data input of said latch circuit.

11. The digital latch as claimed in claim 1, wherein data at said first data input of said latch circuit is a complement of data at said second data input of said latch circuit.

12. A digital latch with a data jitter free clock load, comprising:

a latch circuit having first and second latch data inputs, first and second latch data outputs, and a clock signal input, said latch circuit having a load value relative to a clock driver, said load value changing in response to a change in a state of the data received at said first and second data inputs;

a first sense amplifier having first and second data inputs, first and second outputs, and a clock signal input; and a second sense amplifier having first and second data inputs, first and second outputs, and a clock signal input;

said first output of said first sense amplifier being connected to said first latch data input;

said second output of said first sense amplifier being connected to said second latch data input;

said first output of said second sense amplifier being connected to said first latch data output;

said second output of said second sense amplifier being connected to said second latch data output;

said first input of said first sense amplifier being connected to said first input of said second sense amplifier;

said second input of said first sense amplifier being connected to said second input of said second sense amplifier.

13. The digital latch as claimed in claim 12, wherein said latch circuit includes:

a first switch connected to said first data input and said clock signal input;

a second switch connected to said second data input and said clock signal input;

a first inverter having an input connected to said second switch and said second data output and having an output connected to said first switch and said first data output; and a second inverter having an input connected to said first switch and said first data output and having an output connected to said second switch and said second data output.

14. The digital latch as claimed in claim 12, wherein data at said first data input of said latch circuit is a complement of data at said second data input of said latch circuit.

15. A digital latch with a data jitter free clock load, comprising:

a first inverter stage connected to a first input, said first inverter stage including a first inverter stage first floating node and a first inverter stage first pre-charging device, said first inverter stage including a first inverter stage second floating node and a first inverter stage second pre-charging device;

a second inverter stage connected to a second input, said second inverter stage including a second inverter stage first floating node and a second inverter stage first pre-charging device, said second inverter stage including a second inverter stage second floating node and a second inverter stage second pre-charging device; and a latch circuit having first and second latch data inputs;

said first latch data input being operatively connected to said first inverter stage;

said second latch data input being operatively connected to said second inverter stage;

said latch circuit having first and second latch data outputs;

said first inverter stage first pre-charging device pre-charging said first inverter stage first floating node to a first pre-determined value each clock cycle;

said second inverter stage first pre-charging device pre-charging said second inverter stage first floating node to said first pre-determined value each clock cycle.

16. The digital latch as claimed in claim 15, wherein said first inverter stage second pre-charging device pre-charges said first inverter stage second floating node to a second pre-determined value each clock cycle, and said second inverter stage second pre-charging device pre-charges said second inverter stage second floating node to said second pre-determined value each clock cycle.

17. The digital latch as claimed in claim 16, wherein said first predetermined value is a non-ground voltage and said second predetermined value is a ground voltage.

18. A digital latch with a data jitter free clock load, comprising:

a first inverter stage connected to a first input, said first inverter stage including a first inverter stage first floating node and a first inverter stage first pre-charging device, said first inverter stage including a first inverter stage second floating node and a first inverter stage second pre-charging device;

a second inverter stage connected to a second input, said second inverter stage including a second inverter stage first floating node and a second inverter stage first pre-charging device, said second inverter stage including a second inverter stage second floating node and a second inverter stage second pre-charging device; and a latch circuit having first and second latch data inputs;

said latch circuit having first and second latch data outputs;

said first inverter stage first floating node being formed at a common connection between a first inverter stage first inverting device, a first inverter stage first clock transistor, and said first inverter stage first pre-charging device;

said second inverter stage first floating node being formed at a common connection between a second inverter stage first inverting device, a second inverter stage first clock transistor, and said second inverter stage first pre-charging device;

said first inverter stage including a first inverter stage second floating node formed at a common connection between a first inverter stage second inverting device, a first inverter stage second clock transistor, and said first inverter stage second pre-charging device;

said second inverter stage including a second inverter stage second floating node formed at a common connection between a second inverter stage second inverting device, a second inverter stage second clock transistor, and said second inverter stage second pre-charging device;

said output of first inverter stage first clock transistor being connected to said first latch data input;

said output of second inverter stage first clock transistor being connected to said second latch data input;

said first inverter stage first pre-charging device pre-charging said first inverter stage first floating node to a first pre-determined value when said first inverter stage first clock transistor is OFF;

said second inverter stage first pre-charging device pre-charging said second inverter stage first floating node to said first pre-determined value when said second inverter stage first clock transistor is OFF.

19. The digital latch as claimed in claim 18, wherein said output of first inverter stage second clock transistor being connected to said first latch data input;

said output of second inverter stage second clock transistor being connected to said second latch data input;

said first inverter stage second pre-charging device pre-charging said first inverter stage second floating node to a second pre-determined value when said first inverter stage second clock transistor is OFF;

said second inverter stage second pre-charging device pre-charging said second inverter stage second floating node to said second pre-determined value when said second inverter stage second clock transistor is OFF.

20. The digital latch as claimed in claim 19, wherein said first predetermined value is a non-ground voltage and said second predetermined value is a ground voltage.

* * * * *